(12) United States Patent
Aromin et al.

(10) Patent No.: US 10,950,989 B1
(45) Date of Patent: Mar. 16, 2021

(54) GROUND FAULT CIRCUIT INTERRUPTER (GFCI) LATCHING APPARATUS

(71) Applicants: Victor V Aromin, West Warwick, RI (US); Louis J. Shatkin, Warwick, RI (US)

(72) Inventors: Victor V Aromin, West Warwick, RI (US); Louis J. Shatkin, Warwick, RI (US)

(73) Assignee: Tower Manufacturing Corp., Providence, RI (US)

( * ) Notice: Subject to any disclaimer, the term of this patent is extended or adjusted under 35 U.S.C. 154(b) by 0 days.

(21) Appl. No.: 17/021,500

(22) Filed: Sep. 15, 2020

Related U.S. Application Data

(60) Provisional application No. 62/900,591, filed on Sep. 15, 2019.

(51) Int. Cl.
| | |
|---|---|
| *H01H 83/02* | (2006.01) |
| *H01R 13/713* | (2006.01) |
| *H02H 3/33* | (2006.01) |
| *G01R 31/27* | (2006.01) |
| *H02H 3/02* | (2006.01) |
| *H01H 50/08* | (2006.01) |

(Continued)

(52) U.S. Cl.
CPC ......... *H01R 13/7135* (2013.01); *H01H 83/02* (2013.01); *H02H 3/338* (2013.01); *G01R 31/27* (2013.01); *H01H 50/08* (2013.01); *H01H 2300/052* (2013.01); *H02H 3/00* (2013.01); *H02H 3/02* (2013.01); *H02H 3/162* (2013.01)

(58) Field of Classification Search
USPC .......................................................... 361/42
See application file for complete search history.

(56) References Cited

U.S. PATENT DOCUMENTS

| | | |
|---|---|---|
| 5,517,165 A | 5/1996 | Cook |
| 7,492,558 B2 | 2/2009 | Germain et al. |
| 8,384,502 B2 | 2/2013 | Gao |

(Continued)

*Primary Examiner* — Danny Nguyen

(57) ABSTRACT

A GFCI latching apparatus and circuit is provided. The latching apparatus includes a solenoid; a solenoid plunger, wherein the solenoid plunger comprises a groove; a conical spring disposed at one end of the solenoid plunger; a forked latch, wherein the forked latch engages the groove with its forks. The latch also includes a bevel surface. Also included is a contact carrier having a first position when the solenoid is energized and a second position when the solenoid is deenergized. The contact carrier includes a bevel surface for mating with the latch bevel surface when the solenoid is energized. Also included is a GFCI configured to deenergize the solenoid upon the occurrence of a fault to disengage the latch, the latch thereby disengaging from the contact carrier, causing the contact carrier to move from the first position to the second position. The GFCI circuit detects ground faults and deenergizes the solenoid when a ground fault is detected. The GFCI includes GFCI detection circuitry, wherein the GFCI detection circuitry includes an SCR switch for controlling energizing current for the solenoid; SCR Test Bias circuit for biasing the SCR switch; Self-Test Fault circuit for testing the operation of the GFCI detection circuitry; an Isolation circuit for isolating GFCI detection circuit while self-test is preformed; and power supply circuits for powering the GFCI circuit.

13 Claims, 13 Drawing Sheets

(51) Int. Cl.
*H02H 3/16* (2006.01)
*H02H 3/00* (2006.01)

(56) References Cited

U.S. PATENT DOCUMENTS

| | | |
|---|---|---|
| 8,587,914 B2 | 11/2013 | Kamor et al. |
| 8,760,824 B2 | 6/2014 | Armstrong |
| 9,450,395 B2 | 9/2016 | Aromin et al. |
| 9,608,433 B2 | 3/2017 | Simonin |
| 10,001,526 B2 | 6/2018 | Salas |
| 10,020,649 B2 | 7/2018 | Du |
| 2011/0149453 A1* | 6/2011 | Kamor .................. H01H 71/04 361/62 |

* cited by examiner

GROUND FAULT CIRCUIT INTERRUPTER (GFCI) LATCHING APPARATUS

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 62/900,591, entitled "30A240V GFCI with Self Test and EOL", naming Victor V. Aromin as first named inventor, filed Sep. 15, 2020.

FIELD OF USE

The present invention relates generally to electrical safety devices, and more particularly to a Ground Fault Circuit Interrupter (GFCI) described herein.

DESCRIPTION OF PRIOR ART (BACKGROUND)

Conventional electrical appliances typically receive alternating current (AC) power from a power supply, such as an electrical outlet, through a pair of conducting lines. The pair of conducting lines, often referred to as the line and neutral conductors, enable the electrical appliance, or load, to receive the current necessary to operate.

The connection of an electrical appliance to a power supply by a pair of conducting lines creates a number of potentially dangerous conditions. In particular, there exists the risk of ground fault and grounded neutral conditions in the conducting lines. A ground fault condition occurs when there is an imbalance between the currents flowing in the line and neutral conductors. A grounded neutral condition occurs when the neutral conductor is grounded at the load. Both ground fault and grounded neutral conditions are extremely dangerous and can result in serious injury.

Ground fault circuit interrupters are well known in the art and are commonly used to protect against ground fault and grounded neutral conditions. In general, GFCI devices sense the presence of ground fault and grounded neutral conditions in the conducting lines, and in response thereto, open at least one of the conducting lines between the power supply and the load to eliminate the dangerous condition.

GFCI circuits are well known in the art. In U.S. Pat. No. 5,177,657, to M. Baer et al, there is disclosed a ground fault interrupter circuit which interrupts the flow of current to a pair of lines extending between a source of power and a load. The ground fault interrupter circuit includes a circuit breaker comprising a normally open switch located in one or both of the lines, a relay circuit for selectively closing the normally open switch, an electronic latch circuit operable in first and second bi-stable states and a fault sensing circuit for sensing the presence of a fault condition in at least one of the lines. The electronic latch circuit causes the relay circuit to close the normally open switch and maintain the normally open switch in its closed position when the electronic latch circuit is in the first bi-stable state. The electronic latch circuit also causes the relay circuit to permit the normally open switch to return to its normally open condition when the latch circuit is in its second bi-stable state. A fault sensing circuit senses the presence of a fault condition in at least one of the lines and causes the electronic latch to latch in its second state upon detection of the fault condition.

In U.S. Pat. No. 5,418,678 to T. M. McDonald, there is disclosed an improved ground fault circuit interrupter (GFCI) device which requires manual setting following initial connection to an AC power source or termination of a power source interruption. The improved GFCI device utilizes a controlled switching device which is responsive to a load power signal for allowing the relay contact sets of the GFCI device to be closed only when power is being made available at the output or load terminals. The controlled switching device preferably comprises an opto-isolator or other type of switching device which provides isolation between the GFCI input and output terminals when the relay contact sets are open. The improved GFCI device may be incorporated into portable units, such as plug-in or line cord units, for use with unprotected AC receptacles.

In U.S. Pat. No. 4,816,957 to L. F. Irwin there is disclosed an adapter unit comprising a moisture resistant housing within which is carried an improved, self testing ground line fault interrupter device. The improved device is electrically interconnected with a connector carried externally of the adapter housing so that the unit can be plugged directly into a standard duplex outlet of an existing circuit. The apparatus includes circuitry that automatically tests the operability of the device when it is plugged into a duplex outlet without the need for manual manipulation of test buttons or other overt action by the user.

In U.S. Pat. No. 4,578,732 to C. W. Draper et al there is disclosed a wall socket type ground fault circuit interrupter having a pair of sockets, a reset button and a test button that are accessible from the front of the interrupter. The interrupter has latched snap-acting contacts and a novel latching relay structure for releasably maintaining the snap-acting contacts in a circuit making position. The snap-acting contacts permit all of the components including the monitoring toroids and the power supply to be respectively located and connected at the load side of the snap-acting contacts so that all of the circuits of the interrupter are de-energized when the contacts snap to a circuit opening position. The snap-acting contact mechanism and relay are provided with structures which provide the interrupter with a trip-free mode of contact actuation and accordingly a tease-proof snap-acting contact operation.

In U.S. Pat. No. 8,587,914 there is disclosed, amongst other disclosures a fault interrupter device for selectively disconnecting power between a line side and a load side. In this case, the interrupter device comprises a housing, and a fault detection circuit disposed in the housing and for determining the presence of a fault. In addition, coupled to the fault detection circuit and disposed in the housing is an interrupting mechanism. The interrupting mechanism is configured to disconnect power between the line side and the load side when the fault detection circuit determines the presence of a fault.

A drawback of the GFCI devices of the type described above is that the GFCI latching mechanisms are not pressure balanced to provide ample contact pressure between the contact pads to handle current load without overheating while simultaneously providing balanced spring forces to allow rapid circuit interruption in the event a ground fault is detected.

BRIEF SUMMARY

The foregoing and other problems are overcome, and other advantages are realized, in accordance with the presently preferred embodiments of these teachings.

The invention is directed towards a GFCI latching apparatus including a solenoid; a solenoid plunger, wherein the solenoid plunger comprises a groove; a conical spring disposed at one end of the solenoid plunger; a forked latch, wherein the forked latch engages the groove with its forks. The latch also includes a bevel surface. Also included is a contact carrier having a first position when the solenoid is energized and a second position when the solenoid is deenergized. The contact carrier includes a bevel surface for mating with the latch bevel surface when the solenoid is energized. Also included is a GFCI configured to deenergize the solenoid upon the occurrence of a fault to disengage the latch, the latch thereby disengaging from the contact carrier, causing the contact carrier to move from the first position to the second position.

The invention is also directed towards a GFCI circuit for detecting ground faults and deenergizing a solenoid. The GFCI includes GFCI detection circuitry, wherein the GFCI detection circuitry includes an SCR switch for controlling energizing current for the solenoid; SCR Test Bias circuit for biasing the SCR switch; Self-Test Fault circuit for testing the operation of the GFCI detection circuitry; Isolation circuit 105 for isolating GFCI detection circuit while self-test is preformed; and power supply circuits for powering the GFCI circuit.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
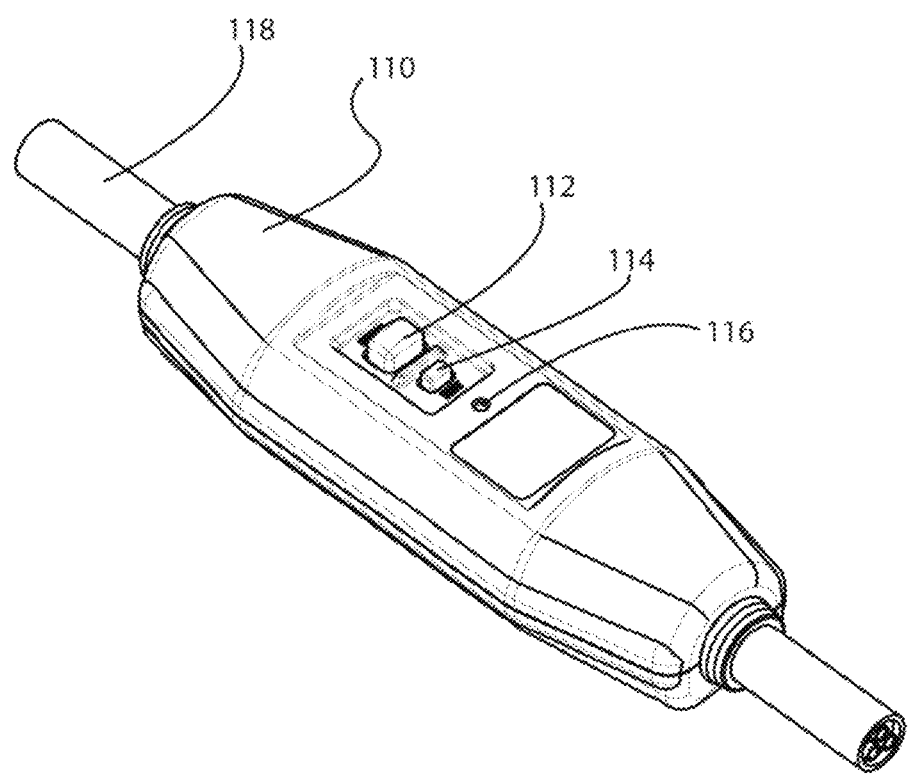
FIG. 1 is a top perspective view of an embodiment of an inline ground fault circuit interrupter (GFCI) employing features of the new invention.
Figure 2:
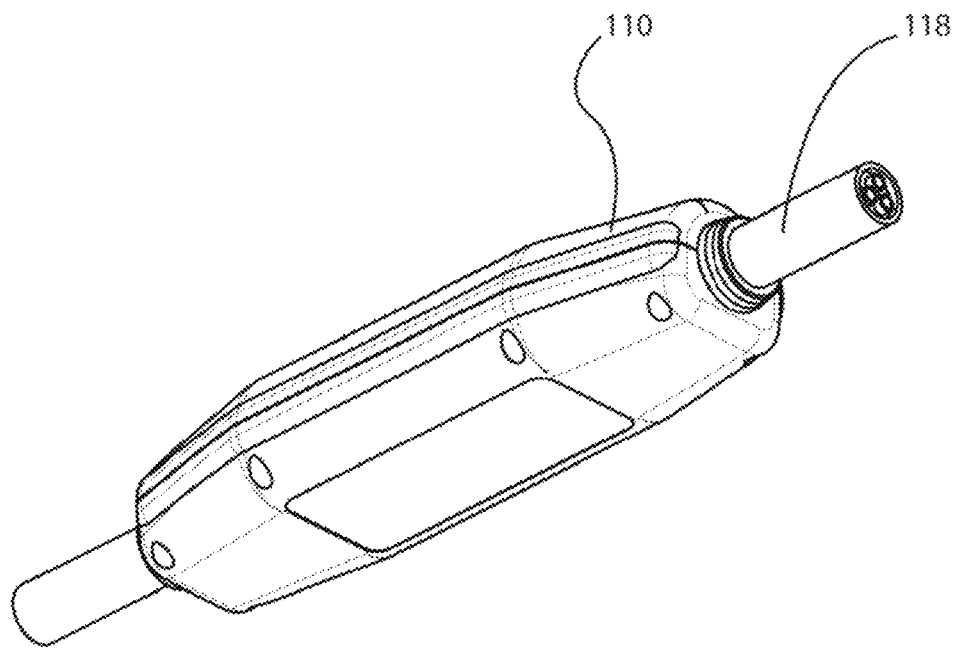
FIG. 2 is a bottom perspective view of the inline GFCI shown in FIG. 1.

Referring now to the drawings and more particularly to FIG. 1 and FIG. 2, there is shown a ground fault circuit interrupter (hereinafter GFCI) constructed according to the teachings of the present invention, the GFCI being represented generally by reference numeral 100, and incorporating the latching apparatus of the subject invention. Shown in FIG. 1 is housing 110, reset 112, test button 114, cord 118, and trip indicator 116.

Figure 3:
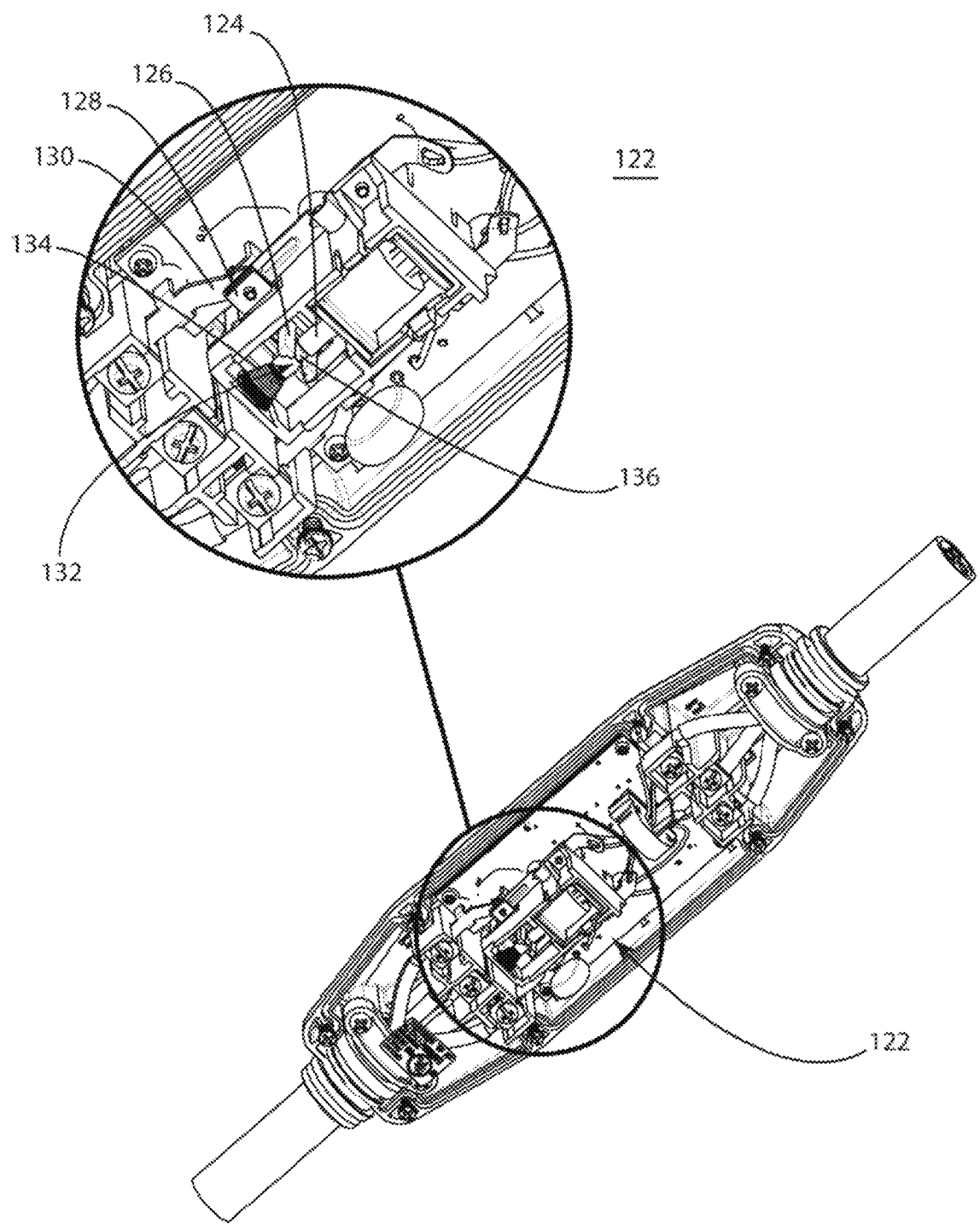
FIG. 3 is a cutaway enlargement of the new latching mechanism features of the new invention shown in FIG. 1.
Figure 4:
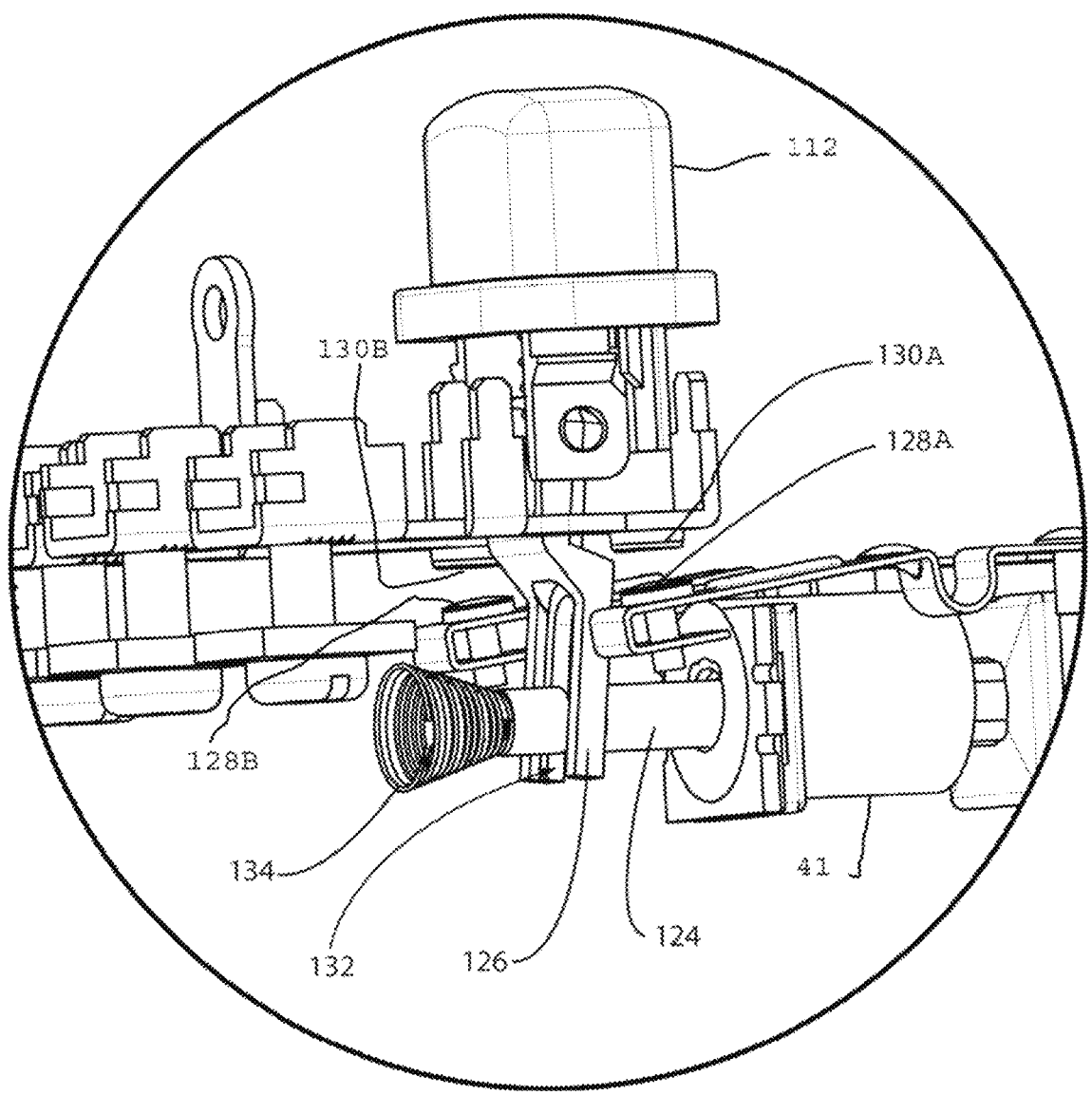
FIG. 4 is an enlargement view of the new latching mechanism features shown in FIG. 3.
Figure 5:
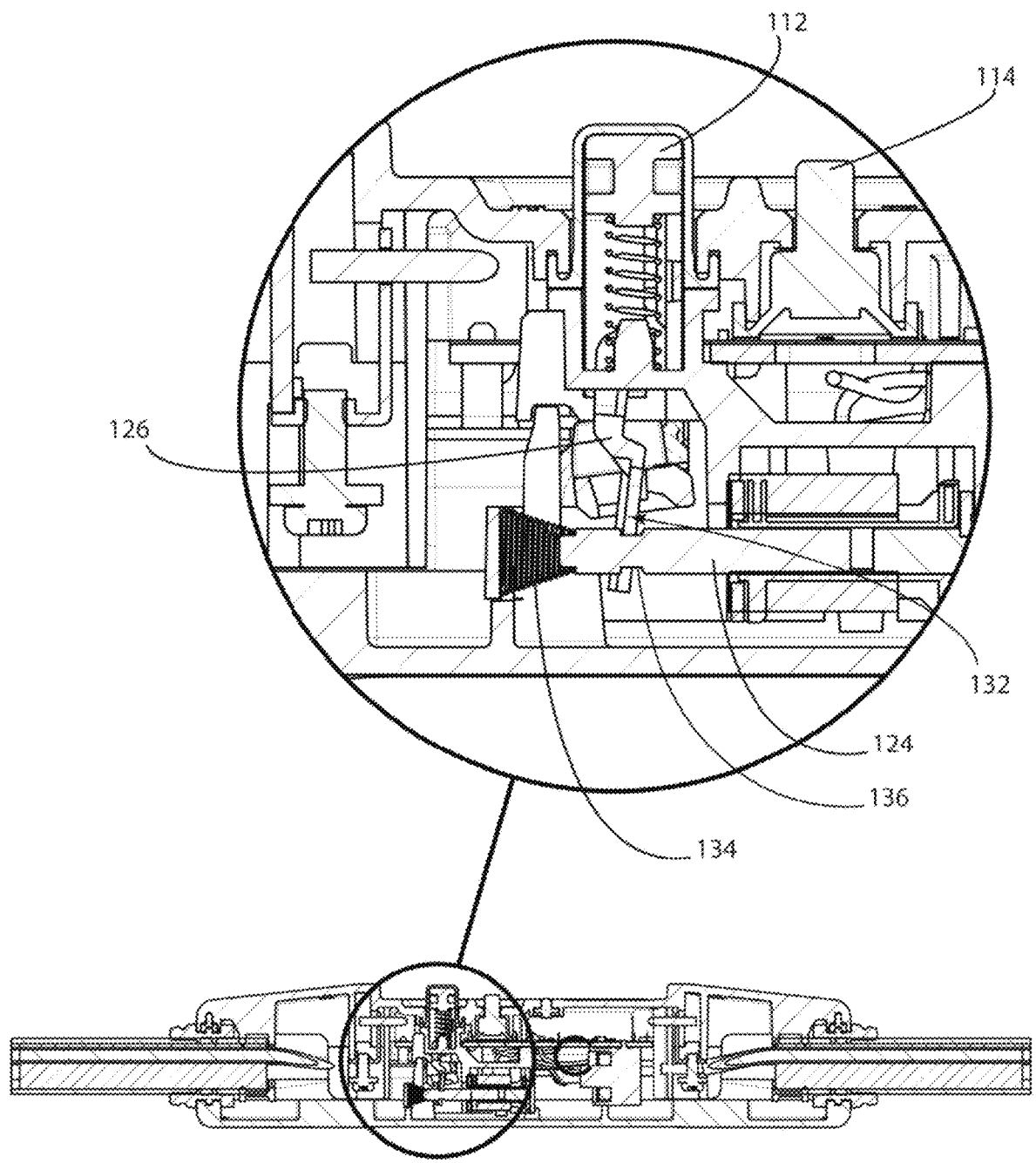
FIG. 5 is an enlargement side view of the new latching mechanism features shown in FIG. 3.

Referring also to FIG. 3, FIG. 4, and FIG. 5 there is shown cutaway enlargements of the new latching mechanism 122 of the new invention shown in FIG. 1. Shown in FIG. 3 is conical plunger spring 134, solenoid plunger assembly 132, plunger groove 136, latch 126, solenoid plunger 124, moveable contact arm 128, and contact 130A. It will be appreciated that latch 126 engages plunger 124 via plunger groove 136.

With reference to FIG. 3, when reset 112 is depressed, latch 126 pushes solenoid plunger 124 into solenoid 41. If solenoid 41 is energized the solenoid 41 holds solenoid plunger and as reset 112 is released latch 126 lifts and holds contact carrier 130 (see FIG. 6A) such the moveable contact arms 128A and 128B contacts 130A and 130B contacts.

If a ground fault is detected the solenoid 41 is deenergized, releasing solenoid plunger 126, and reset spring 62 (see FIG. 6A) disengages latch 126 from contact carrier, which in turn disengages moveable contact arms 128A and 128B from 130A and 130B contacts.

Figure 6A:
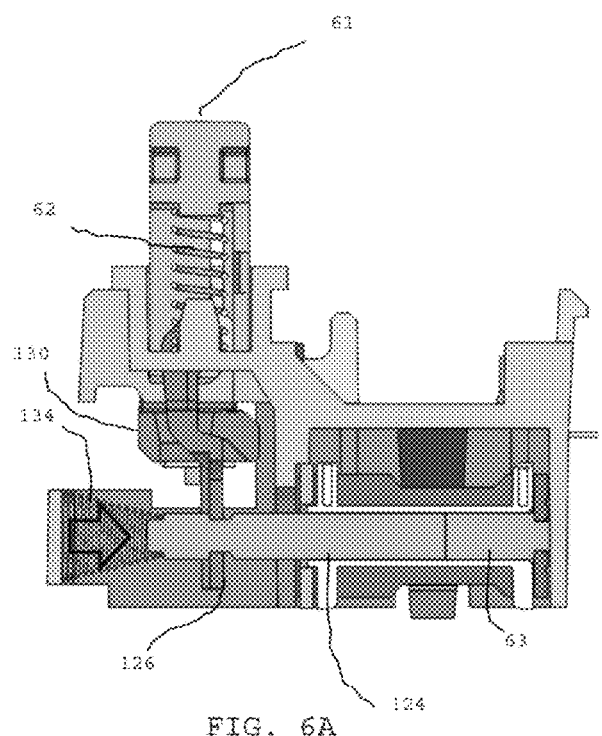
FIG. 6A is an enlargement section side view of the new latching mechanism features shown in FIG. 3 when the contacts are in the closed position.
Figure 6B:
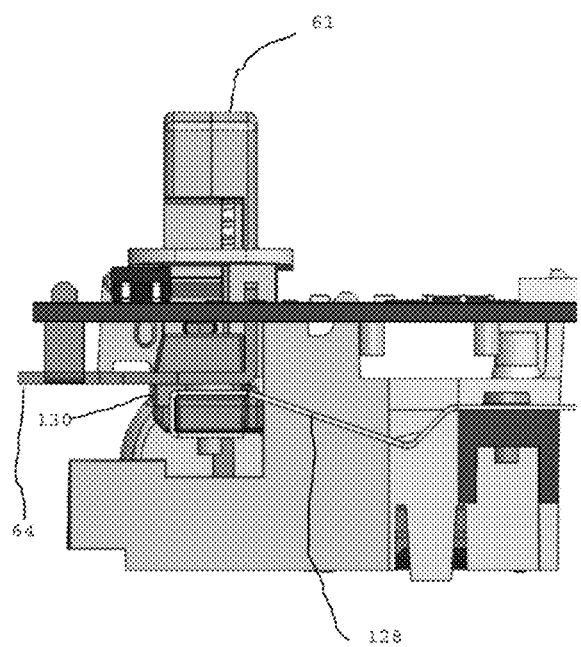
FIG. 6B is an enlargement side view of the new latching mechanism features shown in FIG. 3 when the contacts are in the closed position.

Referring also to FIG. 6A there is shown an enlargement section side view of the new latching mechanism features shown in FIG. 3 when the contacts are in the closed position. Shown in FIG. 6A is reset spring 62, contact carrier 130, conical spring 134, plunger 124, latch 126, input contact terminal 64, and plunger stop 63. Referring also to FIG. 6B there is shown an enlargement side view of the new latching mechanism features shown in FIG. 3 when the contacts are in the closed position.

Figures 7A, 7B:
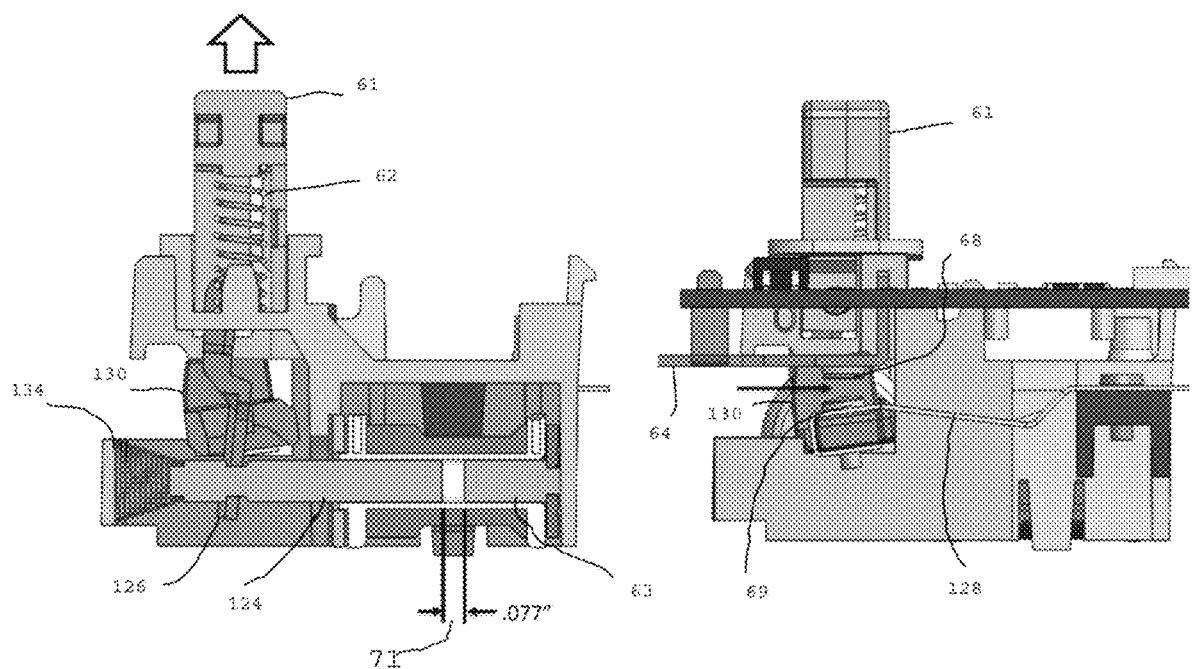
FIG. 7A is an enlargement section side view of the new latching mechanism features shown in FIG. 3 when the contacts are in the open position.
FIG. 7B is an enlargement side view of the new latching mechanism features shown in FIG. 3 when the contacts are in the open position.

Referring also to FIG. 7A there is shown an enlargement section side view of the new latching mechanism features shown in FIG. 3 when the contacts are in the open position. Shown in FIG. 7A is reset spring 62, contact carrier 130, conical spring 134, plunger 124, latch 126, input contact terminal 64, plunger gap 71, and plunger stop 63. Referring also to FIG. 7B there is shown an enlargement side view of the new latching mechanism features shown in FIG. 3 when the contacts 128 are in the closed position.

Figure 8:
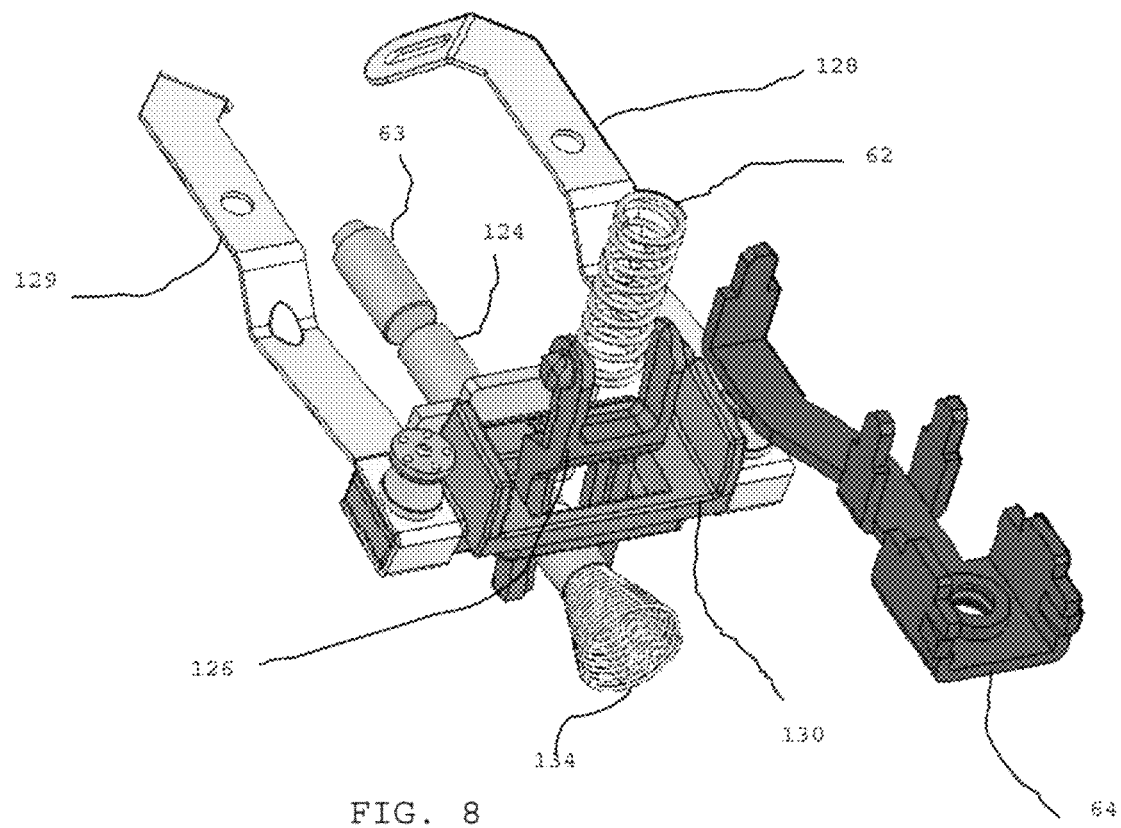
FIG. 8 is a partial internal view of the new latching mechanism features shown in FIG. 3.
Figure 9A:
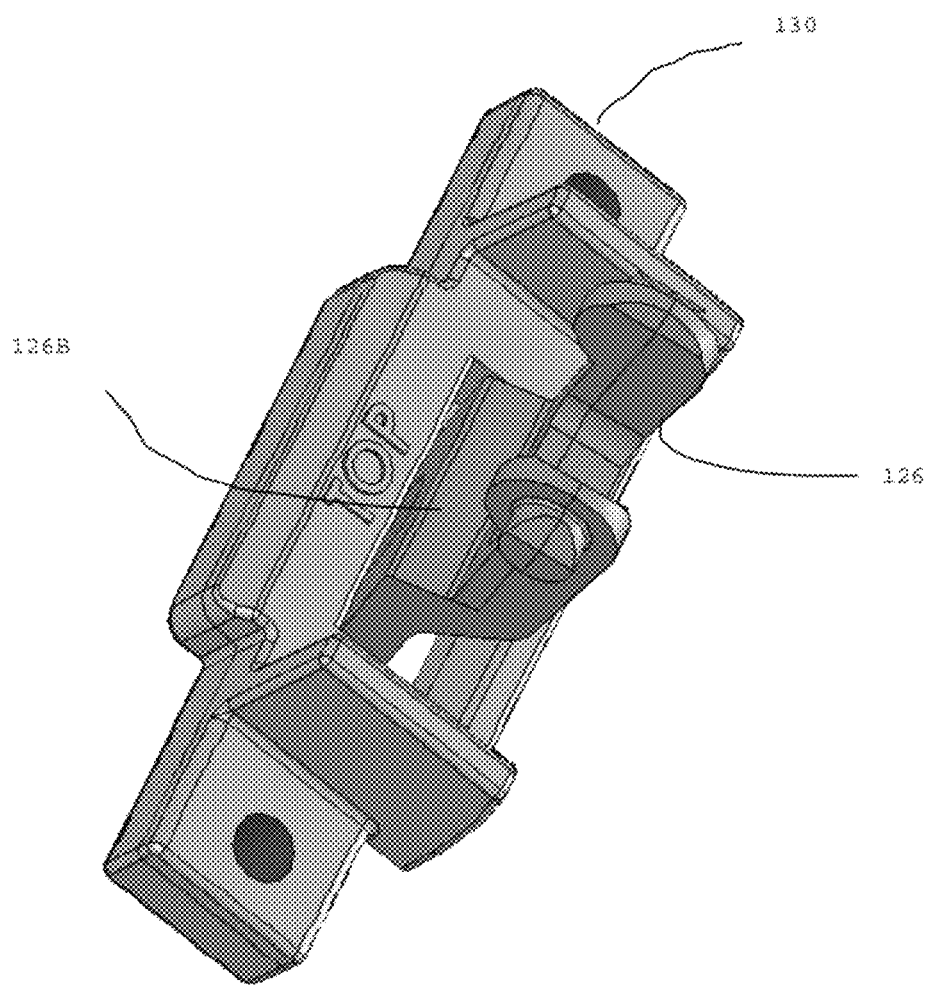
FIG. 9A is an exploded top view of the latch and contact carrier shown in FIG. 6A, FIG. 6B, FIG. 7A, and FIG. 7B.
Figure 9B:
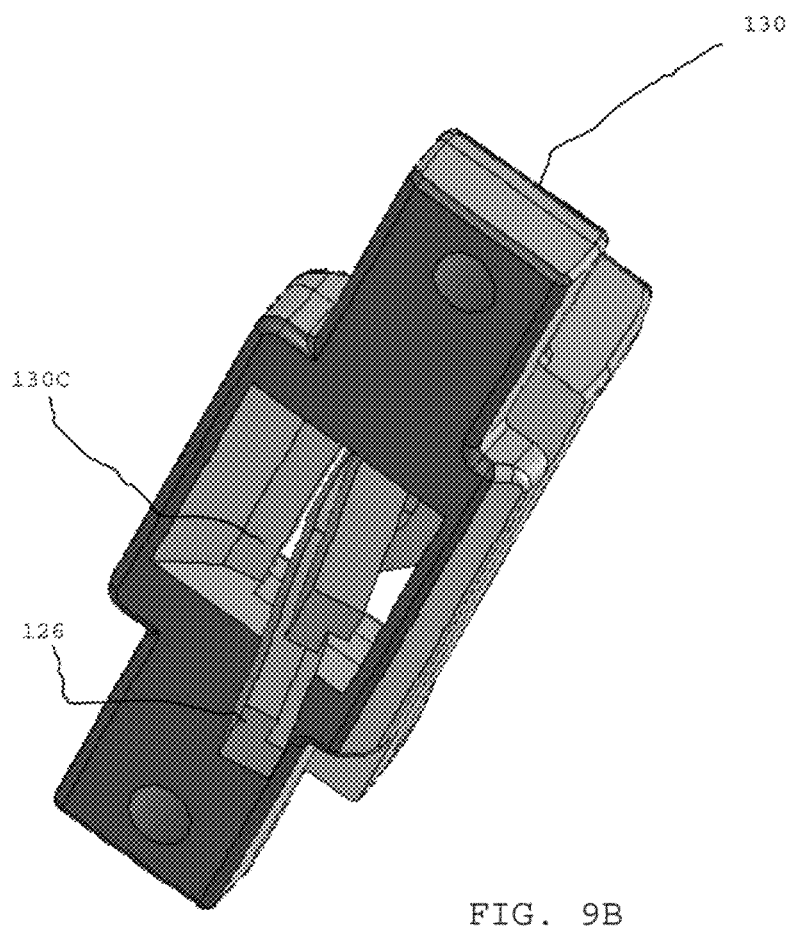
FIG. 9*b* is an exploded bottom view of the latch and contact carrier shown in FIG. 6A, FIG. 6B, FIG. 7A, FIG. 7B, and FIG. 9A.

Referring also to FIGS. 8, 9A, and 9B there is shown a partial internal view of the new latching mechanism features shown in FIG. 3. Shown in FIG. 8 is reset spring 62, contact carrier 130, conical spring 134, plunger 124, latch 126, input contact terminal 64 (for clarity only one input contact terminal is shown), moveable contact arms 128, 129 plunger gap 71, and plunger stop 63. It will be appreciated that conical spring 134 facilitates latch 126 to engage contact carrier 130 in any position of the GFCI. It will be appreciated that the optimum spring force is approximately 0.05 lbs to engage and disengage latch. It will be further understood that conical spring 134 force is balanced with respect to reset spring 62 force (substantially 1.75 lbs is selected to provide ample contact pressure to handle current without overheating), the matching bevel surface 126B angles of latch 126 and bevel surface 130C of contact carrier 130, and gap 71. It will be further understood that the aforementioned balance provides provide ample contact pressure between the contact pads, 68, 69 (shown in FIG. 78) to handle current load without overheating while simultaneously providing balanced spring forces to allow rapid circuit interruption in the event a ground fault is detected. If a ground fault is detected the spring force, approximately 1.03 lbs is designed to rapidly disengage the latch from the contact carrier. The overtravel spring force of spring 62 is approximately 2.73 lbs.

Figure 10A:
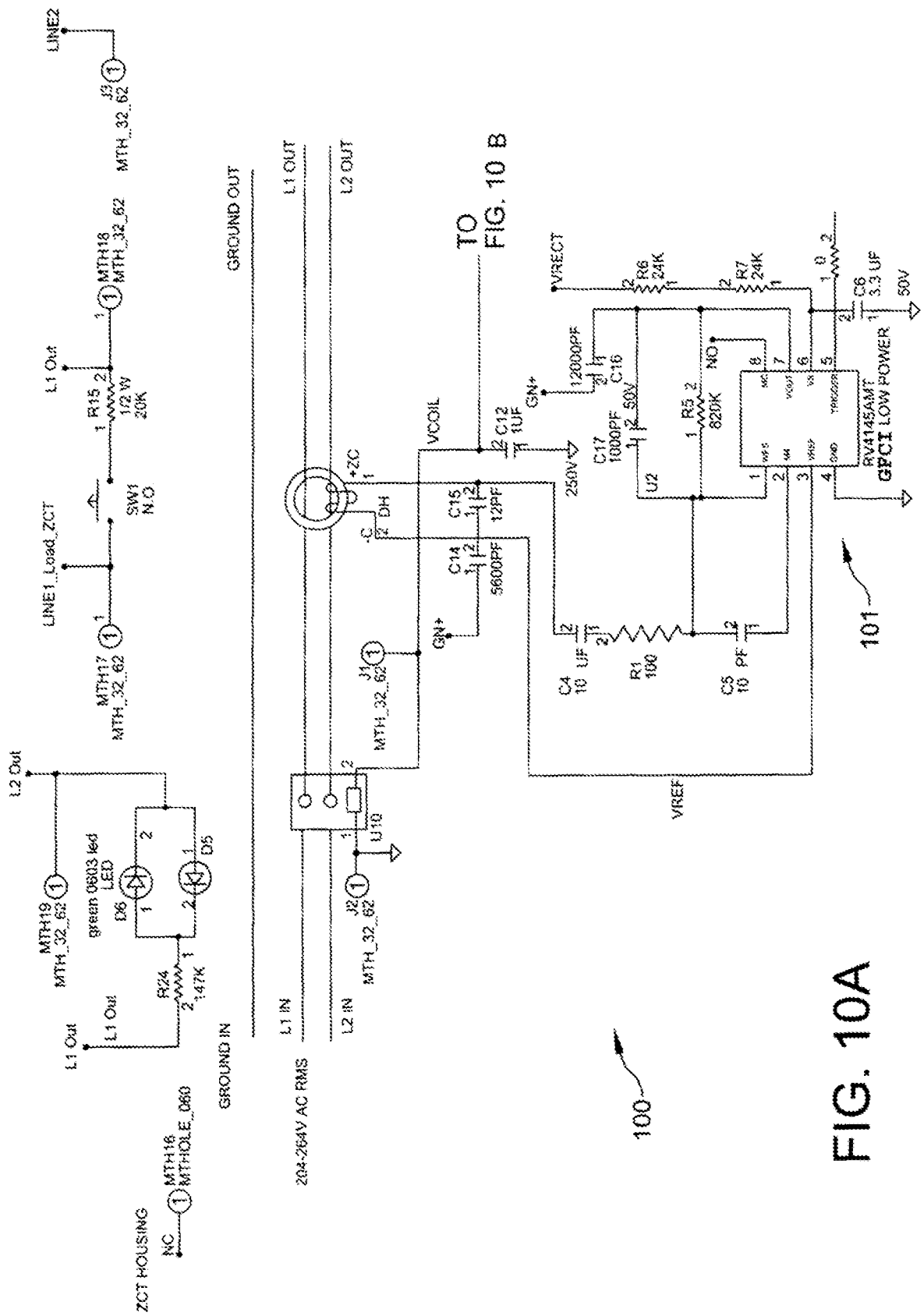
FIGS. 10A-10C is a GFCI circuit schematic for detecting ground faults and employing features of the new invention shown in FIGS. 1-9.
Figure 10B:
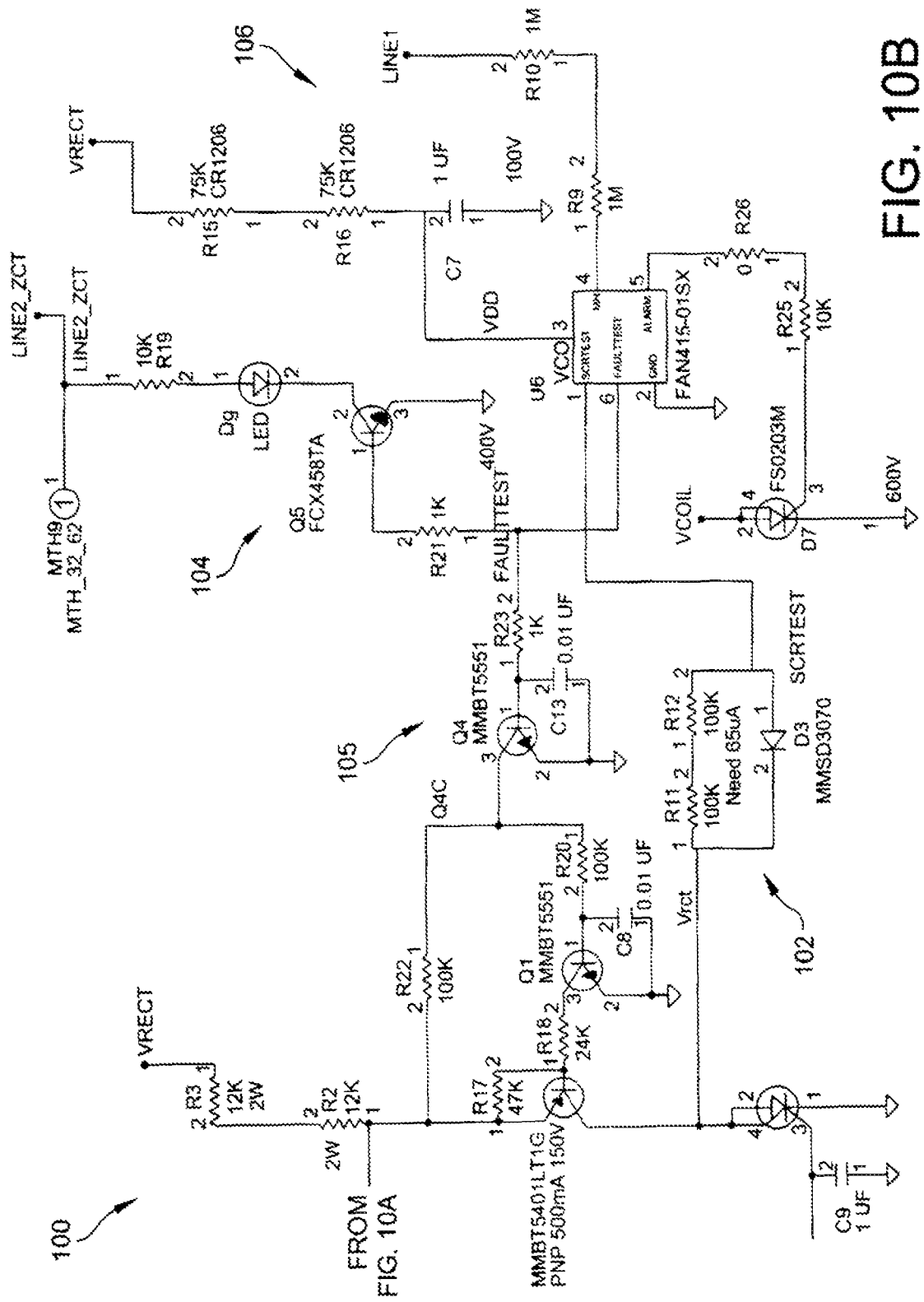
Figure 10C:
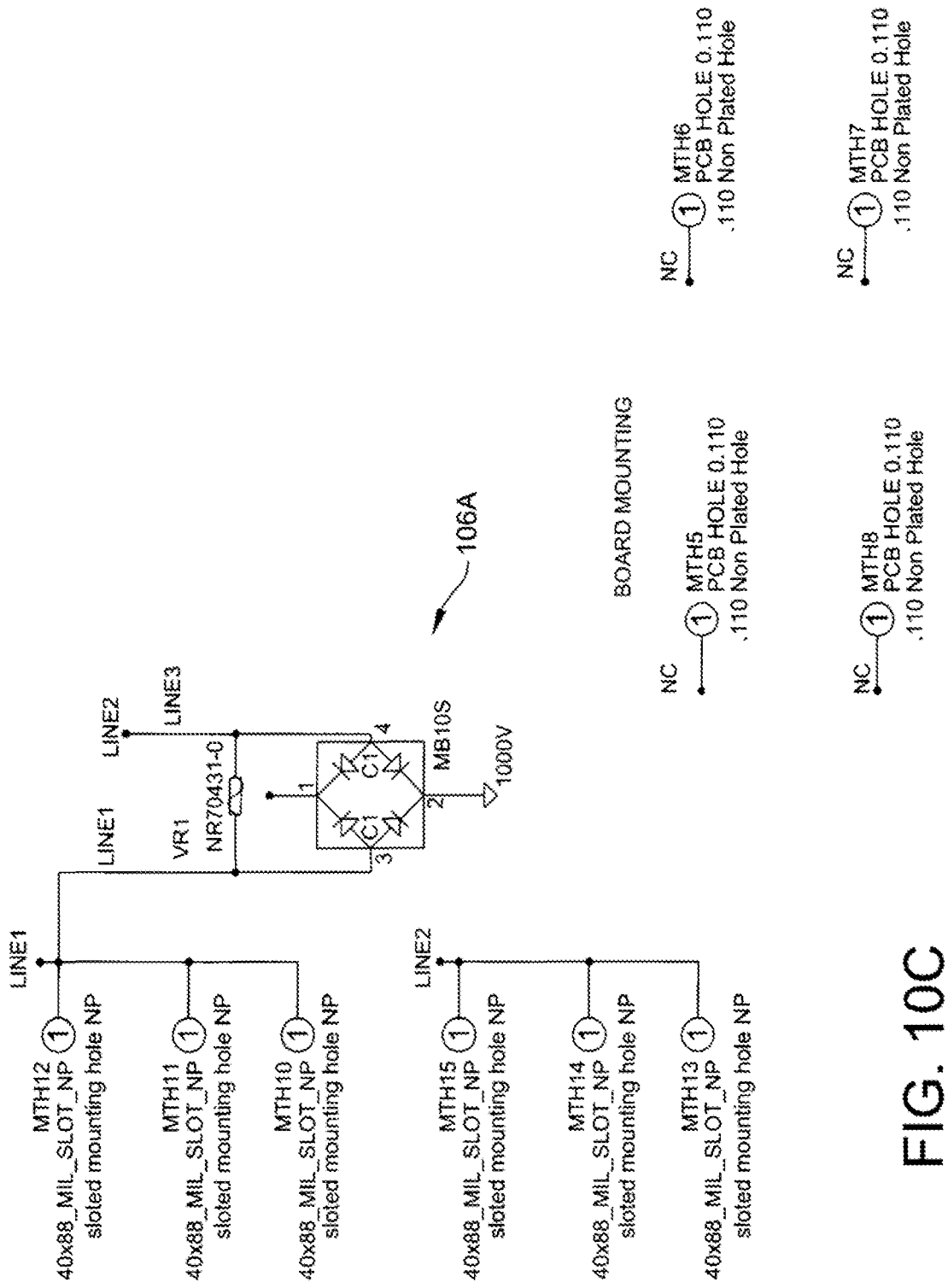

Referring also to FIG. 10 there is shown a GFCI circuit 100 suitable for detecting ground faults and energizing and deenergizing solenoid 41 shown in FIG. 4. Circuit 100 includes GFCI detection circuitry 101, SCR Test Bias circuit 102, Self-Test Fault circuit 104. Isolation circuit 105 for isolating GFCI detection circuit 101 while self-test is preformed, and power supply circuits 106 and 106A.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

What is claimed is:

1. A Ground Fault Circuit Interrupter (GFCI) latching apparatus, the apparatus comprising:
   a solenoid;
   a solenoid plunger, wherein the solenoid plunger comprises a groove;
   a latch, wherein the latch engages the groove;
   a pair of moveable contact arms;
   a pair of contacts corresponding to the pair of moveable contact arms;
   a lifter;
   a latch in which the latch engages the lifter and the solenoid plunger groove;
   wherein the lifter is configured to move between a first position which provides electrical continuity between the pair of moveable contact arms when the solenoid is energized and the corresponding pair of contacts, and a second position in which the pair of moveable contact arms and the corresponding pair of contacts are electrically isolated from each other when the solenoid is deenergized; and
   a conical spring disposed at one end of the solenoid plunger external to the solenoid biasing the solenoid plunger towards the solenoid.

2. The GFCI as in claim 1 further comprising a reset button, wherein depressing the reset button when the solenoid is energized configures the lifter to the first position.

3. The GFCI as in claim 2 further comprising a reset spring.

4. The GFCI as in claim 3 wherein the reset spring comprises a spring force of approximately 1.75 lbs. to provide sufficient contact pressure between the pair of contacts corresponding to the pair of moveable contact arms when the solenoid is energized.

5. The GFCI as in claim 1 wherein the conical spring force comprises a spring force of approximately 0.0.5 lbs.

6. The GFCI as in claim 1 further comprising a circuit configured to deenergize the solenoid upon the occurrence of a fault to disengage the latch, the latch thereby disengaging from the contact carrier, causing the contact carrier to move from the first position to the second position.

7. The GFCI as in claim 6 wherein the circuit comprises:
   GFCI detection circuitry;
   an SCR test bias circuit;
   a self-test fault circuit for self-testing the GFCI detection circuitry and the SCR test bias circuit; and
   a isolation circuit for isolating the GFCI detection circuitry and the SCR test bias circuit during self-testing.

8. A Ground Fault Circuit Interrupter (GFCI) latching apparatus, the apparatus comprising:
   a solenoid;
   a pair of contacts;
   a lifter, wherein the lifter is configured to move between a first position which provides electrical continuity between a pair of moveable contact arms when the solenoid is energized and the corresponding pair of contacts, and a second position in which the pair of moveable contact arms and the corresponding pair of contacts are electrically isolated from each other when the solenoid is deenergized;
   a reset button, wherein depressing the reset button when the solenoid is energized configures the lifter to the first position; and
   a conical spring disposed at one end of the solenoid plunger external to the solenoid biasing the solenoid plunger towards the solenoid, wherein the conical spring force comprises a spring force of approximately 0.05 lbs.

9. The GFCI as in claim 8 further comprising a reset spring, wherein the reset spring comprises a spring force of approximately 1.75 lbs. to provide sufficient contact pressure between the pair of contacts corresponding to the pair of moveable contact arms when the solenoid is energized.

10. The GFCI as in claim 8 further comprising a circuit configured to deenergize the solenoid upon the occurrence of a fault to move the lifter from the first position to the second position, wherein the circuit comprises:
    GFCI detection circuitry;
    an SCR test bias circuit;
    a self-test fault circuit for self-testing the GFCI detection circuitry and the SCR test bias circuit; and
    a isolation circuit for isolating the GFCI detection circuitry and the SCR test bias circuit during self-testing.

11. A Ground Fault Circuit Interrupter (GFCI) latching apparatus, the apparatus comprising:
    a solenoid;
    a pair of contacts;
    a lifter, wherein the lifter is configured to move between a first position which provides electrical continuity between a pair of moveable contact arms when the solenoid is energized and the corresponding pair of contacts, and a second position in which the pair of moveable contact arms and the corresponding pair of contacts are electrically isolated from each other when the solenoid is deenergized;
    a reset button, wherein depressing the reset button when the solenoid is energized configures the lifter to the first position; and
    a circuit configured to deenergize the solenoid upon the occurrence of a fault to move the lifter from the first position to the second position, wherein the circuit comprises:
    GFCI detection circuitry;

an SCR test bias circuit;
a self-test fault circuit for self-testing the GFCI detection circuitry and the SCR test bias circuit; and
a isolation circuit for isolating the GFCI detection circuitry and the SCR test bias circuit during self-testing.

12. The GFCI as in claim 11 wherein the isolation circuit comprises a Sziklai Darlington Pair transistor configuration.

13. The GFCI as in claim 11 further comprising a reset spring, wherein the reset spring comprises a spring force of approximately 1.75 lbs. to provide sufficient contact pressure between the pair of contacts corresponding to the pair of moveable contact arms when the solenoid is energized and wherein upon detection of a fault the reset spring comprises a spring force of approximately 1.03 lbs to rapidly disengage the latch from the contact carrier.

\* \* \* \* \*